US011831315B1

(12) United States Patent
Udatha et al.

(10) Patent No.: US 11,831,315 B1
(45) Date of Patent: Nov. 28, 2023

(54) LOW POWER CURRENT MODE LOGIC

(71) Applicant: Cadence Design Systems, Inc., San Jose, CA (US)

(72) Inventors: Sambasiva Rao Udatha, Bangalore (IN); Uma Suri Appa Rao Kandregula, Visakhapatnam (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 17/875,608

(22) Filed: Jul. 28, 2022

Related U.S. Application Data

(60) Provisional application No. 63/228,696, filed on Aug. 3, 2021.

(51) Int. Cl.
*H03K 3/00* (2006.01)
*H03K 3/011* (2006.01)
*H03K 5/02* (2006.01)

(52) U.S. Cl.
CPC ............... *H03K 3/011* (2013.01); *H03K 5/02* (2013.01)

(58) Field of Classification Search
CPC ................................. H03K 3/011; H03K 5/02
USPC .......................................................... 327/306
See application file for complete search history.

(56) References Cited

U.S. PATENT DOCUMENTS

| | | | | |
|---|---|---|---|---|
| 6,927,628 B2 * | 8/2005 | Oshima | ................ | H03G 3/3052 330/133 |
| 7,027,792 B1 * | 4/2006 | Luff | ..................... | H03D 7/1458 455/314 |
| 7,212,798 B1 * | 5/2007 | Adams | ................. | H03G 3/3068 375/345 |
| 7,342,455 B2 * | 3/2008 | Behzad | ................. | H03F 1/0205 455/73 |
| 7,353,010 B1 * | 4/2008 | Zhang | .................. | H03G 3/3068 455/245.2 |
| 7,580,690 B2 * | 8/2009 | Fujishima | ............ | H03G 3/3078 375/345 |
| 7,583,940 B2 * | 9/2009 | Matsuura | .............. | H04L 27/361 455/108 |
| 7,684,772 B2 * | 3/2010 | Lee | ...................... | H03G 3/3078 330/133 |
| 7,808,322 B1 * | 10/2010 | Son | ...................... | H03G 3/3042 330/285 |
| 7,974,304 B2 * | 7/2011 | Xu | ...................... | G06F 13/4286 370/236 |
| 8,144,726 B2 * | 3/2012 | Xu | ...................... | G06F 13/4295 370/236 |
| 8,508,300 B2 * | 8/2013 | Lee | ...................... | H03G 3/3005 330/289 |

(Continued)

OTHER PUBLICATIONS

Lin, Feng (Dan) et al., "A Self-Adaptive and PVT Insensitive Clock Distribution Network Design for High-Speed Memory Interfaces", 2009 IEEE Workshop on Microelectronics and Electron Devices, 2009, pp. 1-4, doi: 10.1109/WMED.2009.4816147. 4 pages.

*Primary Examiner* — Ryan Jager
(74) *Attorney, Agent, or Firm* — Mark Whittenberger, Esq.; Holland & Knight LLP

(57) ABSTRACT

High-speed signal propagation circuits are biased by a temperature-compensating signal-swing calibrator to yield a target output signal amplitude across process, voltage and temperature corners, avoiding the power-consumptive over-biasing conventionally employed to avoid under-amplitude conditions in slow-process, low-voltage and/or high temperature conditions.

18 Claims, 2 Drawing Sheets

(56) References Cited

U.S. PATENT DOCUMENTS

| | | | | |
|---|---|---|---|---|
| 9,143,110 B2* | 9/2015 | Sano | ........................ | H03G 3/30 |
| 9,209,768 B2* | 12/2015 | Mehrmanesh | ....... | H03G 3/3036 |
| 9,900,204 B2* | 2/2018 | Levesque | ................ | H03F 3/195 |
| 10,122,322 B2* | 11/2018 | Lam | ........................ | H03F 3/195 |
| 11,290,058 B2* | 3/2022 | Chao | .................... | H03B 5/1243 |
| 2002/0008580 A1* | 1/2002 | Ohashi | ................. | H03G 1/0029 |
| | | | | 330/254 |
| 2002/0125945 A1* | 9/2002 | Taylor | ...................... | H03F 1/52 |
| | | | | 330/207 P |
| 2003/0013427 A1* | 1/2003 | Ishihara | ............... | H03G 3/3042 |
| | | | | 455/240.1 |
| 2003/0045257 A1* | 3/2003 | Kobayashi | ........... | H03G 3/3036 |
| | | | | 455/234.1 |
| 2003/0193370 A1* | 10/2003 | Leifso | .................. | H03G 1/0023 |
| | | | | 330/254 |
| 2006/0214730 A1* | 9/2006 | Yamakawa | ............. | H03F 1/301 |
| | | | | 330/289 |
| 2010/0237943 A1* | 9/2010 | Kim | ..................... | H03G 3/3052 |
| | | | | 330/254 |
| 2018/0026583 A1* | 1/2018 | Yanduru | ................. | H03F 3/195 |
| | | | | 330/289 |
| 2018/0292235 A1* | 10/2018 | Filatov | ................. | G01D 5/2053 |
| 2019/0356047 A1* | 11/2019 | Guduru | ................... | A24F 40/46 |
| 2020/0091866 A1* | 3/2020 | Chao | .................... | H03B 5/1215 |

\* cited by examiner

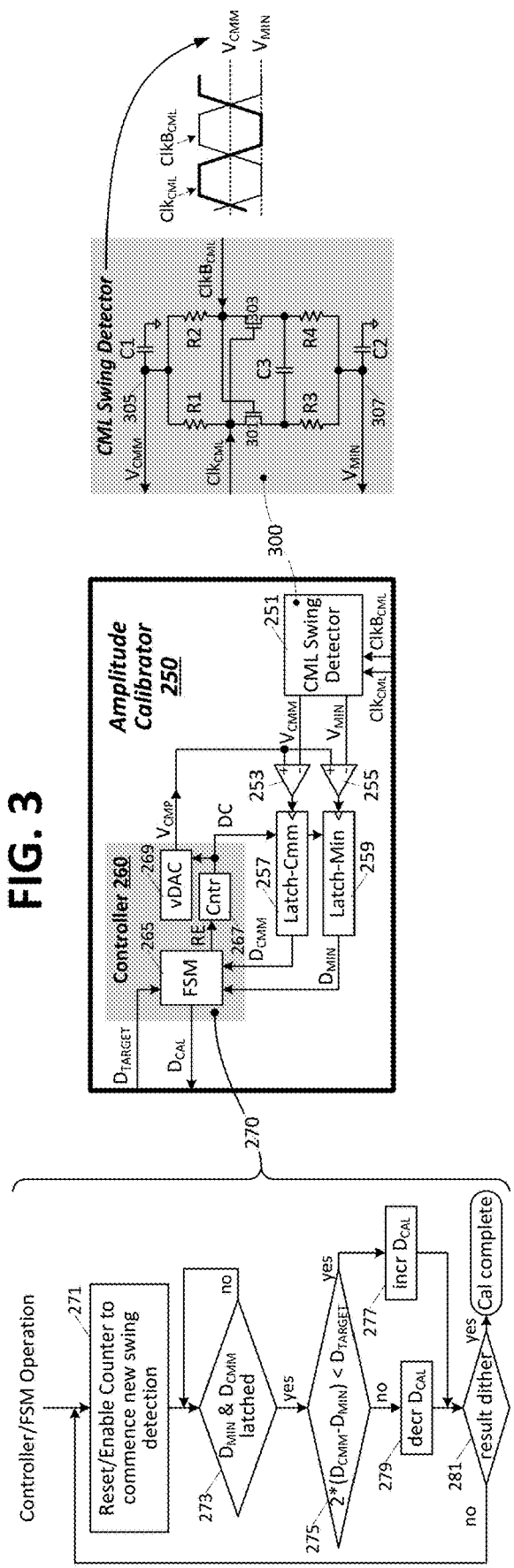
FIG. 3
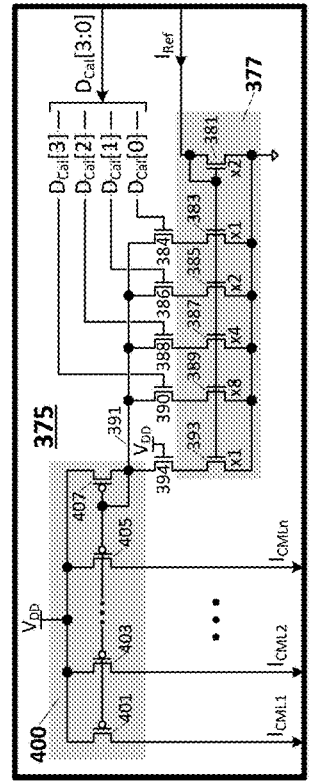
FIG. 4 Temperature-Compensated Reference Current Generator
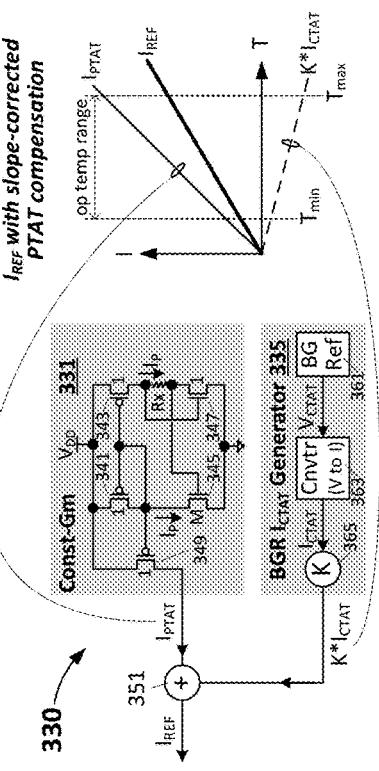
FIG. 5 Mirrored-Output Current-Mode DAC
$I_{CML} = I_{CML-MIN} + D_{cal} * I_{STEP} = I_{REF} * (n1 + D_{cal} * n2)$, where $n1 = n2 = 0.5$

US 11,831,315 B1

LOW POWER CURRENT MODE LOGIC

CROSS REFERENCE TO RELATED APPLICATIONS

This application hereby incorporates by reference and claims the filing-date benefit of U.S. Provisional Application No. 63/228,696 filed Aug. 3, 2021.

TECHNICAL FIELD

The disclosure herein relates to low power signal propagation.

DRAWINGS

The various embodiments disclosed herein are illustrated by way of example, and not by way of limitation, in the figures of the accompanying drawings and in which like reference numerals refer to similar elements and in which:

FIG. 3 illustrates a more detailed embodiment of an amplitude calibrator that may implement amplitude calibrator shown in FIG. 2;

FIG. 4 illustrates an embodiment of a temperature-compensated reference current generator that may implement the temperature-compensated reference current generator of FIG. 2; and FIG. 5 illustrates an embodiment of a mirrored-output current-mode DAC (digital-to-analog converter) that may be used to implement the current-DAC shown in FIG. 2.

DETAILED DESCRIPTION

In various embodiments herein, high-speed signal propagation circuits are biased by a temperature-compensating signal-swing calibrator to yield a target output signal amplitude across process, voltage and temperature corners, avoiding the power-consumptive over-biasing conventionally employed to avoid under-amplitude conditions in slow-process, low-voltage and/or high temperature conditions. In a number of embodiments, the signal-swing calibrator generates delivers a mirrored set of bias currents to daisy-chained current-mode-logic (CML) buffers within a clock propagation/distribution circuit, calibrating those bias currents to yield a final-stage-buffer output clock having a target amplitude (or swing) across a nominal process range (i.e., between acceptably slow and fast process corners) and across time-varying voltage supply and temperature within respective operating voltage and temperature ranges. In system-level implementations, respective instances of the amplitude calibrator are deployed within the per-pin input/output (I/O) circuitry of a chip-to-chip signaling interface to enable high-speed CML clock distribution at substantially lower power than required in conventional over-biasing approaches (i.e., approaches in which CML bias currents are set over-high to ensure reliable operation in worst-case process, voltage, temperature conditions).

Figure 1:
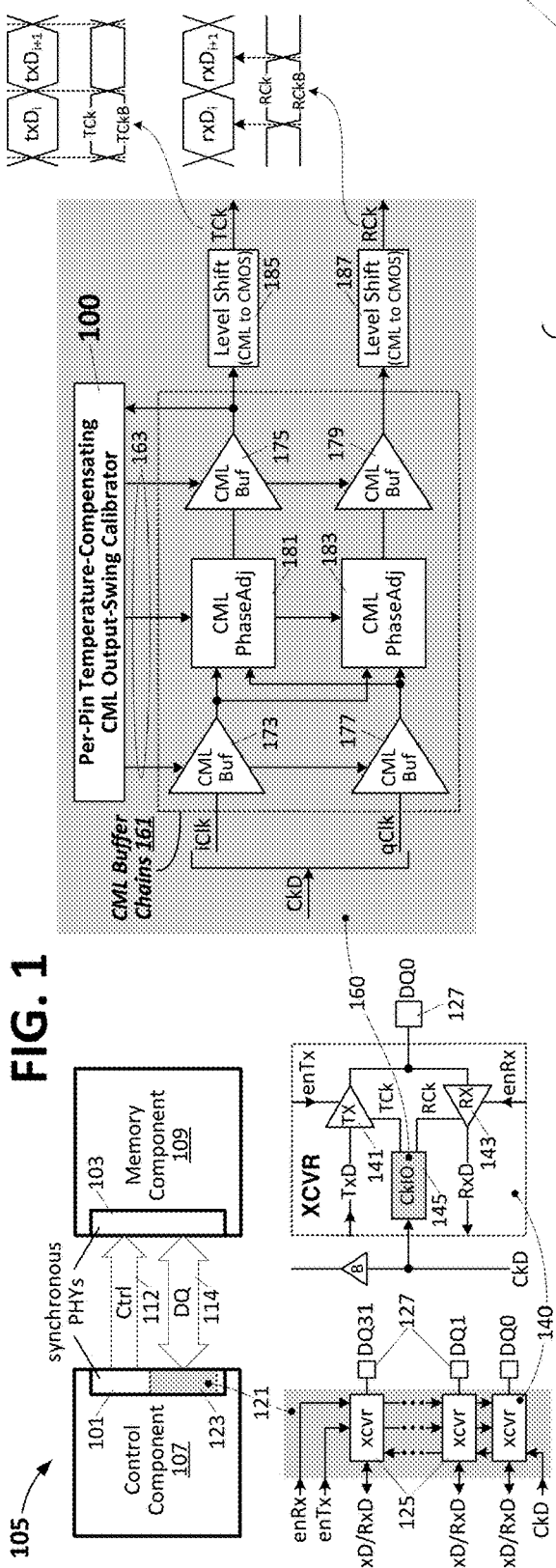
FIG. 1 illustrates an embodiment of a temperature-compensating signal-swing calibrator deployed within one or more chip-to-chip signaling interfaces of a memory system.

FIG. 1 illustrates an embodiment of a temperature-compensating signal-swing calibrator 100 deployed within one or more physical (chip-to-chip) signaling interfaces 101, 103 (PHYs) of a synchronous memory system 105 and more specifically within clock distribution circuitry of those PHYs. In the depicted example, PHYs 101 and 103 are disposed respectively within a memory control component 107 and memory component 109 (e.g., DRAM, Flash memory, etc.) and interconnected by control and data paths (112, 114), the former to convey command, address and control signals (e.g., clock-enable, on-die termination, forwarded clock, etc.) from control component to memory component and the latter to convey write data (transmitted from control component to memory component in association with a write command to effect write-data storage within the memory component) and read data (retrieved from the memory component in response to a read command and transmitted to the control component). As shown in detail view 121 of a data-interface portion (123) of controller-side PHY 101, data transceivers 125 are coupled to constituent data signaling links of data path 114 via respective contact pads 127—32 pads coupled to 32 single-ended data links (DQ0-DQ31) in this example, though more or fewer pads/links and/or differential links (the latter having two contact pads 127 per differential data link) may be implemented in alternative embodiments. In the depicted example, each data transceiver 125 is coupled to host-side data queues (not specifically shown), including without limitation a transmit data queue for delivering a stream of write-data bits, TxD, for transmission via the corresponding data link, and receive data queue into which recovered read data bits, RxD, are loaded for eventual return to a host requester (e.g., CPU, application-specific integrated circuit, etc., within the larger host system—smartphone, computer, appliance, etc.). Data transmission and reception is implemented synchronously with respect to a controller data clock, CkD, and enabled by respective control signals enTx and enRx (e.g., generated by operation-control circuitry within control component 107 in association with command/address values transmitted via control path 112).

In one embodiment, shown in FIG. 1 detail-view 140, each transceiver 125 is implemented at least in part by a transmitter 141, receiver 143 and I/O clock circuit 145, the latter coupled to receive the data clock from a clock tree (e.g., delivering respective same-phase instances of CkD to all transceivers) or serial clock line (e.g., receiving CkD from a tap in a buffered clock distribution line) and in any case outputting a transmit clock (TCk) and receive clock (RCk) to the transmitter and receiver, respectively. The output of transmitter 141 and input of receiver 143 are coupled in common to a contact pad 127—for DQ0 in this isolated example—and the input of transmitter 141 and output of receiver 143 are coupled to respective transmit-data/receive-data lines (i.e., TxD and RxD, conveying write data from/read data to aforementioned write-data/read-data queues). During write data transmission (concurrently with or shortly after transmission of a memory-write command and address via control path 112), operation-control circuitry within control component 107 raises the transmit-enable signal (enTx—enabling operation of transmitter 141) as a serial stream of write data bits (a burst of a programmed or predetermined length) is delivered via transmit-data line TxD to transmitter 141 for bit-by-bit transmission at I/O pad 127 synchronously with edges (transitions) of TCk. Conversely, during read data reception, the operation-control circuitry (not specifically shown) asserts the receive-enable signal (enRx) to enable receiver 143 to sample an incoming read data waveform (arriving via I/O pad 127) synchronously with respect to edges of RCk. Accordingly, both RCk and TCk transition at least once per bit-interval (or unit interval, UI) of the outbound or inbound data signal and thus, in a high-bandwidth/high-speed data I/O implementation (e.g., 2GTs (2×10$^9$ transfers per second), 8GTs, 16GTs or higher), cycle at Gigahertz frequencies. Accordingly, generation (including phase-adjustment) and distribution of the transmit and receive clocks consumes substantial per-pin (per-DQ) power—a power consumption multiplied by the data interface width.

In a number of embodiments, transmit-clock and receive-clock propagation and phase-adjustment circuitry within I/O clock circuit 145 are implemented with current-mode logic (CML)—circuitry capable of producing precisely phased output clocks with reduced power and area overhead relative to traditional CMOS (complementary metal oxide semiconductor) implementations and thus yielding a highly efficient Gigahertz clock distribution architecture. In general, the current mode logic implements a differential or single-ended common-source amplifier output that swings between minimum (lower) and maximum (upper) voltage levels—the difference between those levels being referred to herein as the CML output swing or amplitude or swing amplitude—in response to a single-ended or differential input signal. When implemented by MOS (metal oxide semiconductor) transistors, the output swing of a CML buffer or signal driver is a function of the MOS field-effect transistor (FET) transconductance (gm), pull-up resistance and source bias current (i.e., current drawn via the source terminal of an N-type MOS transistor or delivered via the source terminal of a P-type MOS transistor), with the FET transconductance—and thus the CML buffer output swing—having a significant process, voltage and temperature dependence (higher transconductance at fast process corners, higher voltage and lower temperature; lower transconductance at slow process corners, lower voltage and higher temperature). In contrast to conventional approaches in which the source bias current (CML bias current) is raised as necessary to ensure sufficient CML output swing at the worst-case process, voltage and temperature corner (an approach that yields substantial over-bias and unnecessary power consumption at typical process, voltage and temperature conditions), the bias currents supplied CML buffers and phase-adjustment circuitry within clock—I/O circuit 145 are production-time or run-time calibrated to meet a predetermined output swing target and thereafter dynamically scaled up and down in response to changes in run-time operating temperature.

In the exemplary clock I/O implementation shown in FIG. 1 detail view 160, for example, aforementioned temperature-compensating signal-swing calibrator 100 ("swing calibrator" for brevity) executes a per-pin startup-time swing calibration to set the output swing of one or more CML buffer chains 161 to a target level, effectively setting initial CML bias currents 163 for constituent CML buffers (e.g., 173, 175, 177, 179) and CML phase adjustment circuits (181, 183) in the transmit-clock and receive-clock distribution paths (with the outputs of those clock distribution paths feeding CML clocks to complementary-MOS level shifters 185, 187 for final CMOS-level TCk, RCk generation). After completing the initial calibration, a temperature compensation circuit within swing calibrator iteratively or continuously updates the CML bias currents supplied to CML buffer chains 161 in response to changes in run-time temperature, adjusting the bias current up or down from the initial setpoint as necessary to maintain the nominal output swing target (plus/minus a given tolerance) throughout the operating range of the host integrated circuit component.

In the exemplary clock I/O circuit implementation at 160, quadrature components of the incoming data clock (i.e., an in-phase clock iClk and quarter-cycle-shifted quadrature clock, qClk) are supplied to an initial pair of CML buffers 173 and 177, respectively, with the differential outputs of those CML buffers being supplied to each of phase-adjustment blocks 181 and 183 for the eventual TCk and RCk outputs (though not specifically shown, the CML phase adjusters additionally receive one or more digital phase-control codes that control weighted mixing of the incoming four cycle-distributed CML clocks—i.e., CML clock signals having respective phases of 0°, 90°, 180° and 270°). Final-stage buffers 175, 179 receive the phase-adjusted CML clocks from circuits 181 and 183 and drive buffered instances of those clocks to the aforementioned level-shifters (185, 187). In the specific embodiment shown, swing calibrator 100 receives the output of the final-stage CML buffer 175 in the TCk distribution path only, applying that CML buffer output as a proxy for output swings of other CML buffers (including final-stage RCk CML buffer 179) and CML phase adjusters. In other embodiments, the final RCk CML buffer (179) may supply the input to swing calibrator and/or multiple CML circuit (buffer or phase adjustment) outputs may be multiplexed to the swing calibrator (i.e., such that the calibrator may operate on each of those outputs sequentially or in parallel). Also, where the output of a final-stage CML buffer (175 or 179) is calibrated as a proxy for calibration of upstream CML components (173, 177, 181, 183), upstream CML buffers/phase-adjust blocks may be designed to generate output swings somewhat higher (e.g., according to a predetermined or programmed output swing factor) than that of the final stage to ensure that those upstream components will meet or exceed a target CML output swing at bias levels set according to final-stage CML buffer output calibration.

Figure 2:
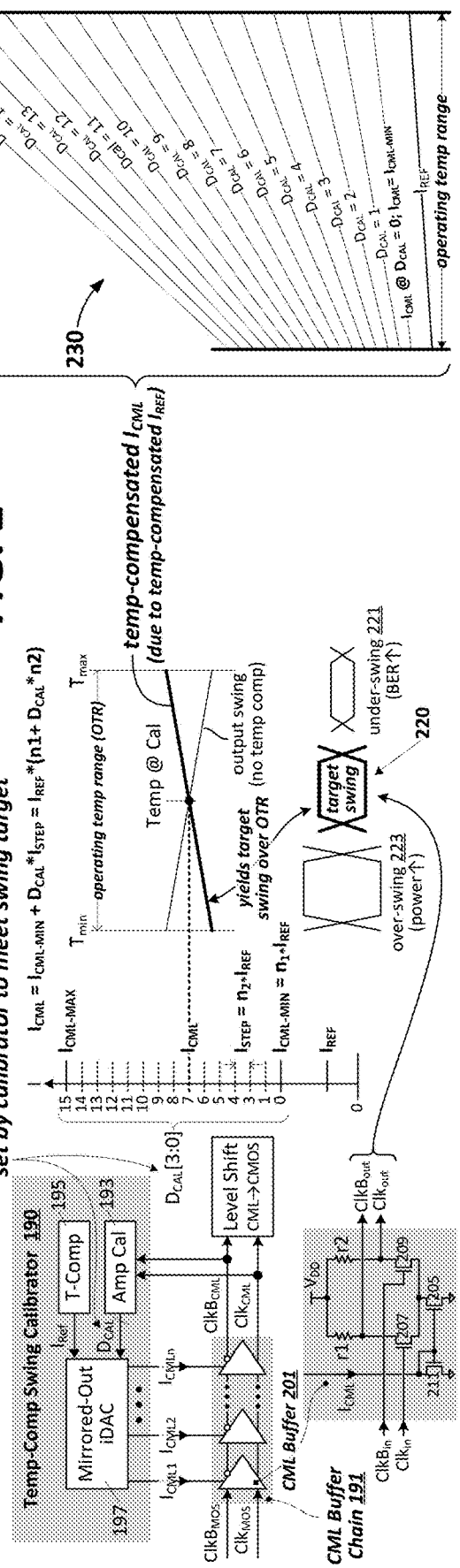
FIG. 2 illustrates an embodiment of a temperature-compensated output swing calibrator in the context of a generalized CML (current-mode-logic) buffer chain.

FIG. 2 illustrates an embodiment of a temperature-compensated output swing calibrator 190 in the context of a generalized CML buffer chain 191 (i.e., applicable within any of the control component or memory component signaling interfaces, clock distribution circuits or any other high-speed CML logic circuitry within the control or memory components or any other integrated circuit component). In the depicted example, swing calibrator 190 includes an amplitude calibrator 193, temperature-compensating reference current generator 195, and mirrored-output current DAC 197 (digital-to-analog converter). Amplitude calibrator 193 receives the differential CML clock output from a final-stage amplifier within the CML buffer chain (Clk$_{CML}$/ClkB$_{CML}$) and delivers a multi-bit digital calibration value (D$_{CAL}$) to current DAC 197 which, in turn feeds respective biasing currents—mirrored instances (I$_{CML1}$, I$_{CML2}$, . . . , I$_{CMLn}$) of the same bias current in one embodiment, though scaled currents may also be generated—to individual CML buffers 201 within the CML buffer chain 191 (any one or more of the buffers 201 may implement or be part of a phase-adjust block as shown at 181/183 in FIG. 1), thus effecting a feedback calibration loop. In the depicted embodiment, each of the CML buffers 201 is implemented by a common-source differential amplifier having a current-bias transistor 205 coupled between ground and the common source terminals of differential input transistors 207 and 209. Drain terminals of transistors 207/209 form the differential (complementary) CML outputs and are pulled up to a supply voltage (VDD in this example) via matching resistive elements r1 and r2. The differential input clock, which may swing at CMOS or CML amplitudes (e.g., at initial CML buffer 201 and ensuing CML buffers, respectively, within chain 191). In the N-MOS current-sinking/pull-down CML buffer shown (transistors 205, 207, 209 may instead be P-MOS transistors with the source of transistor 205 coupled to VDD to effect a current-draw/pull-up CML buffer), the current mirror formed by diode-configured transistor 211 and biasing transistor 205 (i.e., generating a shared gate-to-source voltage established by incoming CML bias current $I_{CML}$) yields a mirrored bias current through transistor 205 (i.e., bias current through transistor 205 scaled relative to incoming $I_{CML}$, according to relative sizes of transistors 205 and 211—which may be matched for unity mirroring). Accordingly, the CML bias current ($I_{CML}$) and transconductance of transistors 207 and 209 (and conductance of resistive elements r1 and r2) establish the CML buffer output swing—the peak difference between the true and complement instances, $Clk_{out}$ and $ClkB_{out}$, of the output clock at the drains of transistors 207 and 209 or, in a single-ended implementation, peak-to-peak amplitude of the output clock at the drain of a single transistor.

In the FIG. 2 embodiment, incremental change in the digital calibration value ($D_{CAL}$) effects a corresponding incremental adjustment in $I_{CML}$ (i.e., $I_{CML}$ increased or decreased by current step, $I_{STEP}$) and thus enables iterative adjustment of $I_{CML}$ as necessary to achieve a target output swing (220). Assuming for purposes of example, that output swing calibration ($I_{CML}$ adjustment) is carried out at a given temperature within the specified operating temperature range (OTR) of the CML buffer chain and host system, subsequent temperature change would, absent temperature compensation, shift the output swing away from calibration target 220, shrinking the output swing at higher/warmer temperatures (as the transconductance of transistors 207 and 209 decreases) and conversely expanding the output swing at lower/colder temperatures—in the former/under-swing case (221) increasing likelihood of bit errors or clock failure and in the latter/over-swing (223) consuming excess/undue power. Temperature-compensating reference-current generator 195 avoids these over-swing/under-swing conditions by scaling a reference current ($I_{REF}$) to establish both a temperature-stable minimum baseline reference current ($I_{CML-MIN}$) and a temperature-stable current step size ($I_{STEP}$) and thus a temperature-compensated $I_{CML}$ that maintains CML buffer output at the nominal calibration target over the full operating temperature range. More specifically, $I_{CML}$ is established in the FIG. 2 embodiment as the baseline (minimum) current $I_{CML-MIN}$ plus the product of $D_{CAL}$ and $I_{STEP}$, with $I_{STEP}$ and $I_{CML-MIN}$ being implemented by respective scaled instances of temperature-compensated reference current $I_{REF}$. That is:

$I_{CML}=I_{CML-MIN}+D_{CAL}*I_{STEP}$ (where '*'denotes multiplication)

$I_{CML-MIN}=n1*I_{REF}$, where 'n1' is a first programmed or predefined scaling factor $I_{STEP}=n2*I_{REF}$, where 'n2' is a second programmed or predefined scaling factor $I_{CML}=I_{REF}*(n1+n2*D_{CAL})$ FIG. 2 depicts an exemplary profile (230) of the temperature-compensated reference current ($I_{REF}$ increasing with temperature as shown) together with corresponding temperature-compensated biasing currents ($I_{CML}$) at each of $2^N$ $D_{CAL}$ settings. The $D_{CAL}$ bit-depth (number of constituent bits, N) is shown as four (4) in FIG. 2—an exemplary bit-depth carried forward in circuit embodiments discussed below, though higher or lower $D_{CAL}$ bit-depths may be implemented in all cases.

FIG. 3 illustrates an embodiment of an amplitude calibrator 250 (e.g., that may implement amplitude calibrator 193 of FIG. 2) having a CML swing detector 251, comparators 253, 255, latch elements 257, 259 and controller 260. Swing detector 251 generates common-mode and peak (minimum) voltage levels of the CML input swing ($V_{CMM}$, $V_{MIN}$), outputting those voltages to comparators 253 and 255, respectively, for comparison with a ramped compare voltage ($V_{CMP}$)—note that the "input swing" at swing detector 251 is, at least in the FIG. 1/FIG. 2 examples, the output swing of a final-stage CML buffer. Latch elements 257 and 259 respond to respective exceedance/cross-over signals from comparators 253 and 255 (i.e., signals indicating that $V_{CMP}$ has transitioned from a voltage level below to a voltage level above a given swing detector output, $V_{MIN}$ or $V_{CMM}$, or vice-versa), to latch digital control words (DAC codes, DC) corresponding to the exceedance-point level of $V_{CMP}$, thus effecting analog-to-digital conversion of voltages $V_{CMM}$ and $V_{MIN}$ to produce corresponding digital values $D_{CMM}$ and $D_{MIN}$. In addition to ramping the DAC code (DC) and compare voltage ($V_{CMP}$), controller 260 adjusts calibration value $D_{CAL}$ based on comparison of the latched $D_{CMM}$ and $D_{MIN}$ values with a programmed and/or otherwise predefined digital representation of the target CML output swing ($D_{TARGET}$). In the exemplary implementation shown, controller 260 includes a finite state machine 265 together with a counter 267 and voltage DAC 269—the counter to sequence the DAC code from a minimum to a maximum count value, and the voltage DAC to generate the analog compare voltage ($V_{CMP}$) in response to the ascending DAC code and thus step-wise ramp $V_{CMP}$ from a minimum to a maximum voltage level to enable (i) comparators 255 and 253 to signal voltage levels at which $V_{CMP}$ exceeds (steps across) the minimum and common mode voltage outputs of swing detector 251, and (ii) latch elements 259 and 257 to capture the DAC codes ($D_{MIN}$ and $D_{CMM}$) corresponding to those cross-over voltages. Alternative types of analog-to-digital converter circuits may be implemented in alternative embodiments (e.g., successive approximation register, etc.), and one or more components of amplitude calibrator 250 (e.g., vDAC 269 and counter 267) may be shared by one or more other per-pin amplitude calibrators (e.g., those within clock I/O circuits 145 for other DQs).

An exemplary operation of controller 260 (and FSM 265) is shown in FIG. 3 detail view 270, starting at 271 with issuance of a reset/enable (RE) signal to counter 267 to commence a new swing detection. At 273, FSM 265 monitors the outputs of latch elements 257/259 (which may be initially reset to predetermined null values) and/or the outputs of comparators 253/255 to determine whether $D_{MIN}$ and $D_{CMM}$ have been latched. When $D_{MIN}$ and $D_{CMM}$ have been latched (affirmative determination at 273), the FSM compares the swing amplitude indicated by $D_{MIN}$ and $D_{CMM}$ with the digital target (e.g., multiplying the difference between the common-mode and minimum CML output levels by two to yield an estimation of the peak-to-peak CML swing or comparing the difference between $D_{CMM}$ and $D_{MIN}$ directly with a digital target halved to reflect the target difference between common-mode and minimum CML outputs). Thereafter the FSM increases or decreases $D_{CAL}$ (at 277 or 279) according to whether the measured swing amplitude (indicated by difference between $D_{CMM}$ and $D_{MIN}$) is less than or greater than the target amplitude, respectively, determining calibration to be complete upon detecting an iterative dither at 281 (i.e., measured amplitude transitioning between below-target and above-target levels in successive loop iterations) and otherwise repeating the operational sequence (calibration loop) starting at 271. In alternative embodiments, instead of concluding calibration upon detecting iterative dither at 281, $D_{CAL}$ may be reset at calibration-start to a zero-level that ensures (under worst-case conditions) any initially latched difference value ($2*(D_{CMM}-D_{MIN})$) will be at or below $D_{TARGET}$. Accordingly, upon iteratively increasing $D_{CAL}$ at 277 to the point of negative determination at 275 (i.e., as $2*(D_{CMM}-D_{MIN})$ is found to exceed $D_{TARGET}$), the calibration operation may be deemed complete (i.e., operations 279 and 281 are omitted from the calibration sequence).

Detail view 300 of FIG. 3 illustrates an exemplary embodiment of CML swing detector 251. In the implementation shown, the true and complement components of an incoming differential CML clock ($Clk_{CML}$ and $ClkB_{CML}$) are coupled to drains of transistors 301 and 303, respectively, and are also cross-coupled to gates of those transistors (i.e., true clock component $Clk_{CML}$ coupled to gate of transistor 303 and complement clock component $ClkB_{CML}$ coupled to gate of transistor 301). Matched load resistances R1 and R2 (generally several orders of magnitude higher resistance than CML buffer pull-up loads r1, r2) are coupled between the drains of transistors 301 and 303, respectively, (and thus to the complementary clock inputs) and the common-mode voltage output node 305, effectively forming a voltage divider that charges capacitor C1 to $V_{CMM}=(Clk_{CML}-ClkB_{CML})*R2/(R1+R2)=0.5*(Clk_{CML}-ClkB_{CML})$ and thus to the common-mode voltage (e.g., average voltage or mid-point voltage) between those differential/complementary clock signal components.

Transistors 303 and 301 are switched on during respective high phases of $Clk_{CML}$ and $ClkB_{CML}$, alternately coupling the low phase of the counterpart clock (via source terminals of transistors 303 and 301) to minimum-voltage output node 307 ($V_{MIN}$) via load resistors R3 and R4, charging capacitor C2 to the low-phase peak of each clock signal and thus to $V_{MIN}$. Capacitor C3 smooths the otherwise abrupt transition at the transistor source terminals (i.e., transition from potential at or near $V_{MIN}$ to a floating state as a given transistor switches off and vice-versa as that transistor is switched on), reducing ripple at the $V_{MIN}$ output without requiring an outsized capacitance at C2.

FIG. 4 illustrates an embodiment of a temperature-compensated reference current generator 330 that may be used to implement FIG. 2 temperature compensator 195. In the depicted implementation, a constant-transconductance ("Const-Gm") circuit 331 generates a proportional-to-ambient-temperature (PTAT) output current ($I_{PTAT}$), while bandgap-referenced current generator 335 produces a scaled complementary-to-ambient-temperature (CTAT) output current ($K*I_{CTAT}$) that, when summed with $I_{PTAT}$, yields a slope-corrected reference current ($I_{REF}$) that inversely models the temperature dependent output swing of a CML buffer. That is, $I_{REF}$ increases with temperature in inverse proportionality (at least nominally) to the decrease in FET transconductance, yielding a temperature-steady CML output swing (according to the calibration target) as shown at 220 in FIG. 2.

In the FIG. 4 constant-transconductance circuit implementation, P-MOS transistors 341/343, N-MOS transistors 345/347 and resistive element Rx effect a temperature-tracking current mirror that delivers, via mirrored P-MOS transistor 349, $I_{PTAT}$ to current summation circuit (or node) 351. More specifically, disparately sized N-MOS transistors 345 and 347 (e.g., with the width/length ratio of transistor 345 and thus the transconductance of that transistor being M times the width/length ratio and transconductance of transistor 347) conduct respective temperature-dependent currents $I_P$ according to the bias point of the current mirror implemented by diode-configured P-MOS transistor 341 and P-MOS transistor 343. As temperature increases, the threshold voltage (Vth) of transistors 345 and 347 increases. Due to this threshold increase, overdrive voltage (Vgs-Vth) of each transistor will increase, accordingly current in the loop $I_P$, increases (proportional to overdrive increase) and gate voltages of 341 and 343 adjusts according to new current value $I_P$—a proportional-to-temperature current increase mirrored at the circuit output (as $I_{PTAT}$) by transistor 349. Since the ratio of $I_P$ to overdrive voltage of 345 and 347 remains nominally the same across process and temperature variations, circuit 331 is referred to herein as a constant-transconductance ("Const-Gm") circuit.

Still referring to FIG. 1, band-gap referenced $I_{CTAT}$ generator—implemented in the depicted embodiment by a bandgap reference voltage generator 361 (generating a voltage, $V_{CTAT}$, that increases as temperature drops and vice-versa) is converted to a current in V-to-I converter 363 (e.g., a MOS transistor having a gate terminal coupled to receive $V_{CTAT}$ from reference voltage generator 361) and then scaled by factor K within amplifier/scaling circuit 365 (e.g., a current mirror having a size-scaled output transistor, or programmably switched current-mirror bank to enable one or more transistors to be ganged to form the current-mirror output and thus a programmable factor K) to deliver output current $K*I_{CTAT}$. The two currents, $I_{PTAT}$ and $K*I_{CTAT}$ are summed within summation circuit 351 (which may be a wired-sum effected by confluence of $I_{PTAT}$ and $K*I_{CTAT}$) to yield the temperate-compensating reference current, $I_{REF}$.

FIG. 5 illustrates an embodiment of a mirrored-output current-mode DAC 375 that may be used to implement current-DAC 197 of FIG. 2. As shown, the temperature-compensating reference current ($I_{REF}$) flows into a digitally-scaled NMOS current mirror 377 implemented collectively by diode-configured transistor 381, binary-weighted output transistors (383, 385, 387 and 389—selectively enabled/coupled to current-mirror output node 391 by counterpart switching transistors 384, 386, 388 and 390 in response to respective bits of $D_{CAL}$) and baseline current (setting $I_{CML-MIN}$) transistor 393 (permanently coupled output node 391 via transistor 394. For purposes of example only, diode-configured N-MOS transistor 381 implemented with twice the size (having twice the width/length ratio or otherwise twice the transconductance) of baseline transistor 393 and also twice the size of the smallest of the binary-weighted $D_{CAL}$-enabled transistors (383)—effectively drawing, from PMOS current mirror 400, a baseline current equal to $n1*I_{REF}$ (where n1 is set by the ratio of the size of transistor 393 to the size of transistor 381 and thus to 0.5 in this example) plus a calibration-configured current equal to $D_{CAL}*n2*I_{REF}$ (where n2 is set by the ratio of the size of transistor 383 to the size of transistor 381 and thus also to 0.5 in this example). Thus, in this 4-bit $D_{CAL}$ example, the current drawn from P-MOS current-mirror 400 (and thus generated as a mirrored set of CML bias currents $I_{CML1}$-$I_{CMLn}$ via P-MOS output transistors 401, 403, . . . , 404, which mirror the current through diode-configured P-MOS transistor 407) is adjustable from $I_{CML-MIN}$ ($0.5*I_{REF}$) to $I_{CML-MAX}$ ($8*I_{REF}$) in fifteen $0.5 I_{REF}$ steps according to the $D_{CAL}$ setting (which switches on current draw contributions in the binary-weighted transistors 383, 385, 387, 389 via switching transistors 384, 386, 388, 390, respectively). Note that the n1 and/or n2 factors may be programmably controlled, for example, by switchably ganging one or more transistors in place of diode-configured transistor 381 and/or any others of transistors 393 and 383, 385, 387, 389.

The various systems, integrated-circuit components, circuit architectures, circuit operations, calibration operations etc. disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit, layout, and architectural expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits and device architectures can be processed by a processing entity (e.g., one or more processors) within the computer system in conjunction with execution of one or more other computer programs including, without limitation, net-list generation programs, place and route programs and the like, to generate a representation or image of a physical manifestation of such circuits and architectures. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply details not required to practice those embodiments. For example, any of the specific quantities/types of signal polarities, transistor types (PMOS vs. NMOS), bit-depths, relative transistor sizes, analog-to-digital conversion implementations, calibration sequences, and the like can be different from those described above in alternative embodiments. Signal paths depicted or described as individual signal lines may instead be implemented by multi-conductor signal buses and vice-versa and may include multiple conductors per conveyed signal (e.g., differential or pseudo-differential signaling). The term "coupled" is used herein to express a direct connection as well as a connection through one or more intervening functional components or structures. Programming of operational parameters (bit-depth, scaling factors, output swing target, scaled buffer output swings, etc.) or any other configurable parameters may be achieved, for example and without limitation, by loading a control value into a register or other storage circuit within above-described integrated circuit devices in response to a host instruction and/or on-board processor or controller (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. An integrated-circuit component comprising:
   a current-mode-logic buffer that generates an output signal having a swing amplitude in accordance with an incoming bias signal;
   a calibration circuit to adjust the bias signal to an initial level that aligns the swing amplitude of the output signal with a predetermined target amplitude; and
   a temperature compensation circuit that adjusts the initial level of the bias signal over time in accordance with changes in temperature.

2. The integrated-circuit component of claim 1 wherein the calibration circuit adjusts the bias signal to the initial level by adding an iteratively determined number of level-steps to a minimum bias signal level.

3. The integrated-circuit component of claim 2 wherein the temperature compensation circuit adjusts the initial level of the bias signal by adjusting both the minimum bias signal level and level-step amplitude in accordance with changes in temperature.

4. The integrated-circuit component of claim 1 wherein the calibration circuit generates a digital measure of the swing amplitude and adjusts a digital calibration value according to relative values of the digital measure and a digital value representative of the predetermined target amplitude.

5. The integrated-circuit component of claim 4 further comprising a programmable register to store the digital value representative of the predetermined target amplitude.

6. The integrated-circuit component of claim 1 wherein the bias signal comprises a bias current that is generated based on a reference current, and wherein the temperature compensation circuit adjusts the reference current over time in response to changes in temperature to adjust the initial level of the bias signal.

7. The integrated-circuit component of claim 1 wherein the temperature compensation circuit comprises a constant-transconductance circuit and a band-gap reference circuit to generate, respectively, component compensation signals that are proportional to ambient temperature and inversely proportional to ambient temperature.

8. The integrated-circuit component of claim 7 wherein component compensation signals are component currents, and wherein the temperature compensation circuit sums the component currents to generate a temperature-compensated reference current.

9. The integrated-circuit component of claim 8 wherein the temperature-compensated reference current is supplied, together with a digital calibration value from the calibration circuit, to a current mirror circuit that outputs, as the bias signal, a bias current to the current-mode-logic buffer.

10. A method of operation within an integrated-circuit component having a current-mode-logic adjusting a bias signal supplied to the CML buffer to an initial level that aligns an output swing amplitude of the CML buffer with a predetermined target amplitude; and adjusting the initial level of the bias signal over time in accordance with changes in temperature.

11. The method of claim 10 wherein adjusting the bias signal to the initial level comprises adding an iteratively determined number of level-steps to a minimum bias signal level.

12. The method of claim 11 wherein adjusting the initial level of the bias signal over time in accordance with changes in temperature comprises adjusting both the minimum bias signal level and level-step amplitude in accordance with changes in temperature.

13. The method of claim 10 wherein adjusting the bias signal to an initial level comprises generating a digital measure of the output swing amplitude and adjusting a digital calibration value according to relative values of the digital measure and a digital value representative of the predetermined target amplitude.

14. The method of claim 13 further comprising storing the digital value representative of the predetermined target amplitude within a programmable register of the integrated-circuit component.

15. The method of claim 10 wherein the bias signal comprises a bias current that is generated based on a reference current, and wherein adjusting the initial level of the bias signal over time in accordance with changes in temperature comprises adjusting the reference current over time in response to changes in temperature.

16. The method of claim 10 wherein adjusting the initial level of the bias signal over time in accordance with changes in temperature comprises generating, within a band-gap reference circuit and a constant-transconductance circuit, respectively, component compensation signals that are proportional to ambient temperature and inversely proportional to ambient temperature.

17. The method of claim 16 wherein component compensation signals are component currents, and wherein adjusting the initial level of the bias signal over time in accordance with changes in temperature comprises summing the component currents to generate a temperature-compensated reference current.

18. The method of claim 17 wherein adjusting the initial level of the bias signal over time in accordance with changes in temperature further comprises supplying the temperature-compensated reference current to a digitally-controlled current mirror circuit that outputs, as the bias signal, a bias current to the CML buffer.

* * * * *